(12) United States Patent
O'Brien et al.

(10) Patent No.: US 7,740,902 B2
(45) Date of Patent: Jun. 22, 2010

(54) METHOD FOR MAKING OXYGEN-REDUCING CATALYST LAYERS

(75) Inventors: Dennis P. O'Brien, Maplewood, MN (US); Alison K. Schmoeckel, Stillwater, MN (US); George D. Vernstrom, Cottage Grove, MN (US); Radoslav Atanasoski, Edine, MN (US); Thomas E. Wood, Stillwater, MN (US); David G. O'Neill, Lake Elmo, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 1033 days.

(21) Appl. No.: 11/379,518

(22) Filed: Apr. 20, 2006

(65) Prior Publication Data

US 2007/0248752 A1  Oct. 25, 2007

(51) Int. Cl.
*C23C 16/00* (2006.01)
*C23C 14/34* (2006.01)

(52) U.S. Cl. ............... 427/115; 427/248.1; 427/376.6; 204/192.1

(58) Field of Classification Search ............... 427/115, 427/248.1, 376.6; 204/192.1
See application file for complete search history.

(56) References Cited

U.S. PATENT DOCUMENTS

| | | | |
|---|---|---|---|
| 4,333,916 A | 6/1982 | Iwai et al. | |
| 4,340,276 A | 7/1982 | Maffitt et al. | |
| 4,568,598 A | 2/1986 | Bilkadi et al. | |
| 4,578,135 A * | 3/1986 | Ueno et al. ............... 156/182 |
| 4,812,352 A | 3/1989 | Debe | |
| 4,985,386 A | 1/1991 | Tsurumi et al. | |
| 5,039,561 A | 8/1991 | Debe | |
| 5,079,107 A | 1/1992 | Jalan | |
| 5,176,786 A | 1/1993 | Debe | |
| 5,240,893 A | 8/1993 | Witherspoon | |
| 5,336,558 A | 8/1994 | Debe | |
| 5,338,430 A | 8/1994 | Parsonage et al. | |
| 5,593,934 A | 1/1997 | Stonehart | |
| 5,643,343 A | 7/1997 | Selifanov et al. | |
| 5,645,951 A | 7/1997 | Johnssen | |
| 5,711,773 A | 1/1998 | Selifanov et al. | |
| 5,872,074 A | 2/1999 | Schulz et al. | |

(Continued)

FOREIGN PATENT DOCUMENTS

DE  100 38 800  6/2002

(Continued)

OTHER PUBLICATIONS

Chemistry World "Less platinum for cheaper fuel cells". Aug. 2, 2005 (no page numbers).*

(Continued)

*Primary Examiner*—Bret Chen
(74) *Attorney, Agent, or Firm*—Brian Morrison; Philip Y. Dahl

(57) ABSTRACT

Methods are provided for making oxygen-reducing catalyst layers, which include simultaneous or sequential stops of physical vapor depositing an oxygen-reducing catalytic material onto a substrate, the catalytic material comprising a transition metal that is substantially free of platinum; and thermally treating the catalytic material. At least one of the physical vapor deposition and the thermal treatment is performed in a processing environment comprising a nitrogen-containing gas.

9 Claims, 7 Drawing Sheets

U.S. PATENT DOCUMENTS

| | | | |
|---|---|---|---|
| 5,879,827 | A | 3/1999 | Debe et al. |
| 5,879,828 | A | 3/1999 | Debe et al. |
| 6,040,077 | A | 3/2000 | Debe et al. |
| 6,136,412 | A | 10/2000 | Spiewak et al. |
| 6,150,569 | A | 11/2000 | Hamann et al. |
| 6,319,293 | B1 | 11/2001 | Debe et al. |
| 6,403,245 | B1 | 6/2002 | Hunt |
| 6,425,993 | B1 | 7/2002 | Debe et al. |
| 6,475,653 | B1 | 11/2002 | Gomez |
| 6,610,436 | B1 | 8/2003 | Dearnaley et al. |
| 6,624,328 | B1 | 9/2003 | Guerra |
| 6,835,489 | B2 * | 12/2004 | Venkatesan et al. ........... 429/40 |
| 7,005,401 | B2 | 2/2006 | Lu et al. |
| 2002/0004453 | A1 | 1/2002 | Haugen et al. |
| 2002/0144394 | A1 * | 10/2002 | Uchida et al. ............... 29/623.5 |
| 2003/0004058 | A1 * | 1/2003 | Li et al. ....................... 502/258 |
| 2003/0124717 | A1 * | 7/2003 | Awano et al. ............ 435/287.2 |
| 2004/0048466 | A1 | 3/2004 | Gore et al. |
| 2004/0058808 | A1 | 3/2004 | Lu et al. |
| 2004/0081880 | A1 | 4/2004 | Chang |
| 2004/0116742 | A1 | 6/2004 | Guerra |
| 2004/0121210 | A1 | 6/2004 | Hamrock et al. |
| 2004/0121221 | A1 | 6/2004 | Suzuki et al. |
| 2004/0197638 | A1 | 10/2004 | McElrath et al. |
| 2004/0197641 | A1 * | 10/2004 | Visco et al. .................. 429/137 |
| 2005/0031921 | A1 * | 2/2005 | Ovshinsky et al. ............ 429/21 |
| 2005/0069755 | A1 | 3/2005 | Vernstrom et al. |
| 2005/0095189 | A1 | 5/2005 | Brey et al. |
| 2005/0095355 | A1 * | 5/2005 | Leistra et al. .................. 427/58 |
| 2005/0176990 | A1 | 8/2005 | Coleman et al. |
| 2005/0200040 | A1 * | 9/2005 | Hara et al. ................... 264/104 |
| 2005/0221155 | A1 * | 10/2005 | McLean et al. ................ 429/38 |
| 2006/0088739 | A1 * | 4/2006 | Ovshinsky ...................... 429/9 |
| 2006/0194092 | A1 * | 8/2006 | Kanai et al. .................... 429/34 |
| 2006/0264319 | A1 * | 11/2006 | Yoo et al. .................... 502/101 |
| 2007/0082814 | A1 | 4/2007 | Debe et al. |
| 2007/0248875 | A1 * | 10/2007 | O'Brien et al. ................ 429/44 |
| 2008/0113257 | A1 * | 5/2008 | Hampden-Smith et al. .... 429/42 |
| 2008/0274269 | A1 * | 11/2008 | Bose et al. ................... 427/115 |
| 2009/0226796 | A1 | 9/2009 | Atanasoski et al. |

FOREIGN PATENT DOCUMENTS

| | | |
|---|---|---|
| JP | 2004/217977 | 8/2004 |

OTHER PUBLICATIONS

Chemical & Engineering News, "Nanotube Catalysts: Nitrogen-doped carbon nanotubes could make fuel cells more affordable". vol. 87, No. 6, Feb. 9, 2009 p. 7.*

Hitachi Australia: New catalyst for oxygen-reducing reactions from Hitachi Maxell. (Apr. 4, 2008) no page numbers.*

"Platinum-Nickel Alloy Found to be Most Active Oxygen-Reducing Catalyst Ever Reported". Jan. 30, 2007, no citation, no page numbers.*

M. K. Debe, "Novel Catalysts, Catalysts Support and Catalysts Coated Membrane Methods," *Handbook of Fuel Cells, Fundamentals, Technology and Applications*, vol. 3, (pp. 576-589).

Markovic, et al., Oxygen Reduction Reaction on Pt and Pt Bimetallic Surfaces: A Selective Review, *Fuel Cells*, vol. 1, No. 2, 2001, (pp. 105-116).

Paulus, et al., "Oxygen Reduction on Carbon-Supported Pt-Ni and Pt-Co Alloy Catalysts" *J. Phys. Chem. B, No. 106*, 2002, (pp. 4181-4191).

Lefevre, et al., "O2 Reduction in PEM Fuel Cells: Activity and Active Site Structural Information Catalysts Obtained by the Pyrolysis at High Temperature of Fe Precursors", *J. Phys. Chem. B*, Sep. 7, 2000, (pp. 11238-11247).

Jaouen, et al., "Oxygen Reduction Catalysts for Polymer Electrolyte Fuel Cells From the Pyrolysis of Iron Acetate Adsorbed on Various Carbon Supports", *J. Phys. Chem. B*, vol. 107, Oct. 18, 2002, (pp. 1376-1386).

N. J. Kim, "Structure and Properties of Rapidly Solidified Al-Li-Cu-Mg-Zr Alloys with a High Zirconium Content", *Materials Science and Engineering*, A158, 1992, (pp. 103-110).

Kam, et al., "Summary Abstract: Dramatic Variation of the Physical Microstructure of a Vapor Deposited Organic Thin Film", *J. Vac. Sci. Technol.* A, 5 (4), Jul./Aug. 1987, (pp. 1914-1916).

Debe, et al., Vacuum Vapor Deposited Thin Films of a Perylene Dicarboximide Derviative: Microstructure Versus Deposition Parameters:, *J. Vac. Sci. Technol.* A, 6 (3), May/Aug. 1988, (pp. 1907-1911).

Debe et al., "Effect of Gravity on Copper Phthalocyanine Thin Films III: Microstructure Comparisons of Copper Phthalocyanine Thin Films Grown in Microgravity and Unit Gravity", *Thin Solid Films*, 186, 1990, (pp. 327-347).

Sadaoka et al., "Effects of Morphology on $NO_2$ Detection in Air at Room Temperature With Phthalocyanine Thin Films", *J. Mat. Sci.*, 25, 1990, (pp. 5257-5268).

Ohnuma et al., "Amorphous Ultrafine Metallic Particles Prepared by Sputtering Method", Rapidly Quenched Metals,( Steeb, et al. Eds.); from the Proc. of the Fifth Int. Conf. on Rapidly Quenched Metals in Wurzburg, Germany, Sep. 3-7, 1984. *Elsevier Science Publishers B.V.*, New York, 1985, (pp. 1117-1124).

Lee et al., "Measurement and Modeling of the Reflectance-Reducing Properties of Gradient Index Microstructured Surfaces", *Photo. Sci. and Eng.*, 24, (4), Jul./Aug. 1980, (pp. 211-216).

Tang et al., "High Dispersion and Electrocatalytic Properties of Platinum on Well-Aligned Carbon Nanotube Arrays," Carbon, 42 2004, (pp. 191-197).

Stanishevsky, "Quaziamorphous Carbon and Carbon Nitride Films Deposited from the Plasma of Pulsed Cathodic Arc Discharge," *Chaos, Solitons and Fractals*, vol. 10, No. 12, 1999, (pp. 2045-2066).

Dahn, et al., "Economical Sputtering System to Produce Large-Size Composition-Spread Libraries Having Linear and Orthogonal Stoichiometry Variations", *Chemistry of Materials*, 14 (8), 2002, (pp. 3519-3523).

Easton, et al., "Preparation and Characterization of Sputtered $Fe_{1-x}N_x$ Films", *Thin Solid Films*, 493, 2005, (pp. 60-66).

Villers, et al., "Fe-Based Catalysts for Oxygen Reduction in PEM Fuel Cells: Pretreatment of the Carbon Support", *J. Electrochem. Soc.* 151, (9), 2004, (pp. A1507-A1515).

Lefevre, et al., "Fe-Based Catalysts for the Reduction of Oxygen in Polymer Electrolyte Membrane Fuel Cell Conditions: Determination of the Amount of Peroxide Released During Electroreduction and its Influence on the Stability of the Catalysts", *Electrochimica Acta*, 48, 2003, (pp. 2749-2760).

Paik, et al., "Extent of PEMFC Cathode Surface Oxidation by Oxygen and Water Measured by CV", *Electrochemical and Solid-State Letters*, 7, (4), 2004, (pp. A82-A84).

Atanasoski, "2004 DOE Hydrogen, Fuel Cells, and Infrastructure Technologies Program Review Meeting", May 24-27, 2004, Philadelphia, PA, Presentation FC17, (pp. 1-16).

Faubert, et al., "Oxygen Reduction Catalysts for Polymer Electrolyte Fuel Cells From the Pyrolysis of $Fe^{II}$ Acetate Adsorbed on 3,4,9,10-Perylenetetracarboxylic Dianhydride", *Electrochimica Acta*, 44, 1999, (pp. 2589-2603).

Chow et al.; "Fabrication of Biologically Based Microstructure Composites for Vacuum Field Emission", *Materials Science and Engineering*, A158 (1992), pp. 1-6.

J.P. Dodelet, "Oxygen Reduction by Non-Noble Metal Catalysis in PEM Fuel Cell Conditions", Keynote Lecture at $4^{th}$ International Conference on Electrocatalysis, Sep. 2002, Como, Italy (Abstract available).

* cited by examiner

METHOD FOR MAKING OXYGEN-REDUCING CATALYST LAYERS

This invention was made with U.S. Government support under Cooperative Agreement DE-FC36-03GO13106 awarded by the Department of Energy. The U.S. Government has certain rights in this invention.

CROSS-REFERENCE TO RELATED APPLICATION(S)

Reference is hereby made to co-pending patent application Ser. No. 11/379,523 filed on even date. Apr. 20, 2006, entitled "OXYGEN-REDUCING CATALYST LAYER".

FIELD OF THE INVENTION

The present invention relates to membrane electrode assemblies for use in electrochemical devices, such as fuel cells. In particular, the present invention relates to methods of making catalyst layers for use in membrane electrode assemblies.

BACKGROUND OF THE INVENTION

Fuel cells are electrochemical devices that produce usable electricity by the catalyzed combination of a fuel such as hydrogen and an oxidant such as oxygen. In contrast to conventional power plants, such as internal combustion generators, fuel cells do not utilize combustion. As such, fuel cells produce little hazardous effluent. Fuel cells convert hydrogen fuel and oxygen directly into electricity, and can be operated at higher efficiencies compared to internal combustion generators.

A fuel cell such as a proton exchange membrane (PEM) fuel cell typically contains a membrane electrode assembly (MEA), formed by an electrolyte membrane disposed between a pair of catalyst layers, which are correspondingly disposed between a pair of gas diffusion layers. The respective sides of the electrolyte membrane are referred to as an anode portion and a cathode portion. In a typical PEM fuel cell, hydrogen fuel is introduced into the anode portion, where the hydrogen reacts and separates into protons and electrons. The electrolyte membrane transports the protons to the cathode portion, while allowing a current of electrons to flow through an external circuit to the cathode portion to provide power. Oxygen is introduced into the cathode portion and reacts with the protons and electrons to form water and heat.

A common obstacle in the commercial application of PEM fuel cells is the performance of the catalyst layers. Despite its cost, platinum is currently the material of choice for catalyst layers. However, to achieve desirable operation voltages, large amounts of platinum are required for the catalyst layers, which increases material costs. Additionally, at high voltages, platinum may react with water and/or oxygen, thereby producing an oxide layer that inhibits its catalytic activity in the oxygen reduction reaction. As such, there is a need for alternative catalyst materials, and methods of making catalyst layers from such materials, that provide advantages in terms of cost, performance, and durability.

BRIEF SUMMARY OF THE INVENTION

The present invention relates to a method of making an oxygen-reducing catalyst layer. The method includes physical vapor depositing a catalytic material onto a substrate from a target that includes a transition metal substantially free of platinum. The method further includes thermally treating the catalytic material. At least one of the physical vapor deposition and the thermal treatment is performed in a processing environment comprising a nitrogen-containing gas.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale. Like reference numbers have been used throughout the figures to denote like parts.

DETAILED DESCRIPTION

Figure 1:
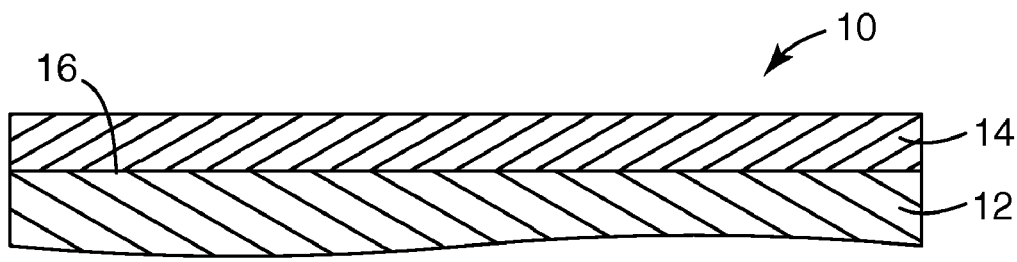
FIG. 1 is a sectional view of an oxygen-reducing catalyst layer.

FIG. 1 is a sectional view of catalyst layer 10, which is an oxygen-reducing catalyst layer manufactured pursuant to the method of the present invention. Catalyst layer 10 includes substrate 12 and film 14, and is suitable for use in a PEM fuel cell (e.g., a cathode catalyst layer in an MEA). Substrate 12 includes surface 16, where film 14 is disposed on surface 16. Film 14 compositionally includes catalyst material that is substantially free of platinum, and as discussed below, is formed by a combination of physical vapor deposition (PVD)

processing and thermal treatment. As a result, catalyst layer 10 exhibits good catalytic activity for reducing oxygen while also being substantially free of platinum, which is defined herein to mean about 5 micrograms/centimeter$^2$ or less of platinum in catalyst layer 10.

Figure 2:
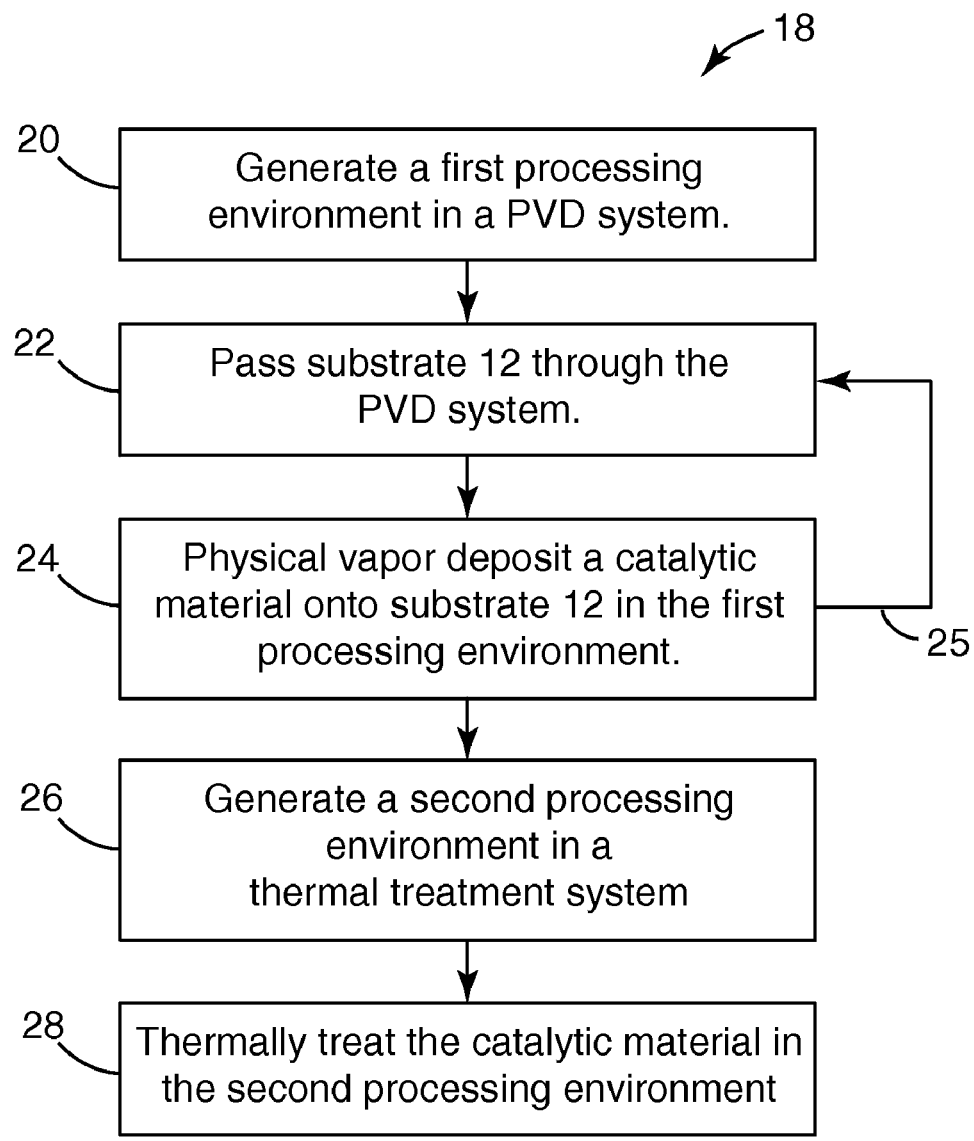
FIG. 2 is a flow diagram of a method for making an oxygen-reducing catalyst layer.

FIG. 2 is a flow diagram of method 18 for making catalyst layer 10, and includes steps 20-28. Method 18 initially involves generating a "first processing environment" in a physical vapor deposition (PVD) system (step 20), where the PVD system includes a carbon target and a transition metal target that is substantially free of platinum. The first processing environment is generated by evacuating the PVD system to a reduced pressure (e.g., about 1×10$^{-5}$ Torr or less), and then introducing a gas until an operating pressure is reached. Examples of suitable operating pressures for the first processing environment range from about 0.5 milliTorr to about 5 milliTorr.

Examples of suitable gases for the first processing environment include nitrogen-containing gases, oxygen, water vapor, hydrogen, argon, and combinations thereof. Examples of particularly suitable gases for the first processing environment include nitrogen-containing gases, such as nitrogen, ammonia, nitrogen-containing volatile organic compounds (e.g., pyridine, acetonitrile, pyrrole, pyrrolidine, and quinoline) and combinations thereof.

Substrate 12 is then passed through the PVD system (step 22), thereby exposing substrate 12 to the first processing environment. Examples of suitable materials for substrate 12 include nanostructured thin film substrates (e.g., substrates disclosed in Parsonage et al., U.S. Pat. No. 5,338,430, and in Debe, U.S. Pat. Nos. 4,812,352 and 5,039,561), microstructured thin film substrates (e.g., substrates disclosed in Spiewak et al., U.S. Pat. No. 6,136,412), carbon-containing substrates, carbon-containing woven fabrics, carbon-containing non-woven fabrics, titanium suboxide ceramics (e.g., ceramics commercially available under the trade designation "EBONEX" from Ebonex Corp., Melvindale, Mich.), nano-tin oxide films, nano-titanium oxide films, non-film-based carbon-containing particles and powders, carbon-containing fibers, and combinations thereof.

Such materials are thermally stable to withstand the high temperatures of the subsequent thermal treatment. As used herein, the term "thermally stable" refers to the ability of a material to withstand a temperature of at least about 350° C., and more desirably of at least about 500° C., for a duration of up to two hours with substantially no degradation.

The PVD system then deposits a catalytic material onto substrate 12 via generating atoms in the vapor phase by a physical process (e.g., sputtering and cathodic arc) in the first processing environment (step 24). For example, during a sputtering process, a field is applied to gas of the first processing environment, which creates a self-sustaining plasma of ionized atoms. The ionized atoms collide with the carbon target and the transition metal target, thereby dislodging carbon atoms and transition metal atoms. The dislodged atoms then travel toward substrate 12, where they condense along with gas atoms. This provides film 14 of catalytic material on surface 16 of substrate 12. In an alternative embodiment, the carbon and transition metal depositions may be carried out sequentially in two separate systems.

In embodiments where substrate 12 is derived from powders or particles, the powders or particles may be moved by agitation during the PVD process. An example of a suitable agitation process is described in Brey et al., U.S. Publication No. 2005/0095189. The resulting catalytic material-coated powders or particles are further activated as described herein for planar substrates and films.

As discussed above, the transition metal target is substantially free of platinum. Moreover, in one embodiment, the transition metal target is also substantially free of all precious metals, such as ruthenium, rhodium, palladium, osmium, iridium, platinum, gold, and silver. Precious materials have high material costs, and are required in large amounts to achieve desirable operation voltages and currents. In comparison, examples of suitable transition metals for the transition metal target include iron, cobalt, and combinations thereof. These suitable transition materials are less expensive than precious metals, thereby reducing material costs during manufacturing.

Because film 14 is formed by the condensation of the carbon atoms, the ionized atoms, and the transition metal atoms on substrate 12, the catalytic material compositionally includes carbon, the transition metal, and the gas atoms deposited (e.g., nitrogen). Accordingly, the catalytic material of film 14 is also substantially free of platinum (and in one embodiment, is also free of all precious metals). An example of a particularly suitable composition of the catalytic material of film 14 may be represented by the formula $C_{1-x-y}$—$N_x$-$M_y$, (x+y<1) where $M_y$ is a non-platinum transition metal, such as iron, cobalt, and combinations thereof.

Examples of suitable atomic percentages of carbon in the catalytic material of film 14 range from about 50.0% to about 99.8%, with particularly suitable atomic percentages of carbon ranging from about 80.0% to about 95.0%. Examples of suitable atomic percentages of nitrogen in the catalytic material of film 14 range from about 0.1% to about 45.0%, with particularly suitable atomic percentages of carbon ranging from about 4.0% to about 20.0%. Examples of suitable atomic percentages of the transition metal in the catalytic material of film 14 range from about 0.01% to about 15.0%, with particularly suitable atomic percentages of carbon ranging from about 2.0% to about 10.0%.

PVD processing typically deposits thin layers of materials during a single pass. With respect to the current invention, the thickness of deposited film 14 may vary based on the PVD parameters, such as power settings, the composition and concentration of the gas in the first processing environment, and the line speed of substrate 12. Therefore, to increase the thickness of deposited film 14, substrate 12 may pass through the PVD system in multiple cycles (as represented by phantom arrow 25) until a suitable thickness of film 14 is obtained. Accordingly, examples of suitable thicknesses for film 14 range from about 10 nanometers to about 5,000 nanometers, with particularly suitable thicknesses ranging from about 100 nanometers to about 500 nanometers planar equivalent.

Once film 14 is deposited onto substrate 12, the resulting coated substrate (referred to herein as 12') is then placed in a thermal treatment system, and a second processing environment is generated in the thermal treatment system (step 26). The thermal treatment system may be any type of suitable heating system, such as a convection oven or a quartz-tube furnace. As discussed below, in one embodiment, the thermal treatment system is a heating element disposed in the PVD system. This allows the PVD processing (step 24) and the thermal treatment (step 28, discussed below) to be performed substantially simultaneously in a single apparatus (as shown below in FIG. 4).

The second processing environment is generated by introducing a treatment gas into the thermal treatment system to substantially purge the residual gases. Examples of suitable and particularly suitable treatment gases for the second processing environment include the suitable and particularly suitable gases discussed above for the first processing environment. It is believed that nitrogen atoms in the catalytic material increases the catalytic activity of catalyst layer 10. Therefore, at least one of the first processing environment and the second processing environment includes a nitrogen-containing gas. Accordingly, processing environments including nitrogen-containing gases may be generated during either the PVD process or the thermal treatment. In one embodiment, processing environments including nitrogen-containing gases are generated during both the PVD process and the thermal treatment.

Once the second processing environment is generated, the catalytic material of film 14 is then thermally treated while in the second processing environment (step 28). The thermal treatment may be performed with a variety of thermal profiles and/or in multiple steps. For example, the temperature may be ramped up at a given rate (e.g., 6° C./minute) until a processing temperature is reached, and then held at the processing temperature for a desired duration (e.g., 15 minutes). Examples of suitable processing temperatures include temperatures of at least about 350° C., with even more suitable processing temperatures including temperatures of at least about 600° C., and with yet even more suitable processing temperatures including temperatures of at least about 900° C.

The composition of the gas employed for the second processing environment may also be changed during the thermal treatment process, providing two or more steps. For example, a processing environment including a first gas composition of ammonia and hydrogen can be used for an initial thermal treatment step (e.g., heating to temperatures of about 350° C. to about 600° C.), and a second gas composition of ammonia and nitrogen can be used for a second thermal treatment step (e.g., heating to about 600° C.).

Once the thermal treatment is complete, the resulting catalyst layer 10 may then be removed from the thermal treatment system for use in PEM fuel cells. The combination of the PVD processing and the thermal treatment allows catalyst layer 10 to exhibit good catalytic activity in reducing oxygen. Examples of suitable oxygen-reduction catalytic activities for catalyst layer 10 include at least about 0.02 milliamps/centimeter$^2$ (mA/cm$^2$) at 0.6 volts versus a reversible hydrogen electrode (RHE), with particularly suitable oxygen-reduction catalytic activities for catalyst layer 10 including at least about 0.05 mA/cm$^2$.

Additionally, the above-discussed suitable atomic percentages for the catalytic material of film 14 allow catalyst layer 10 to be corrosion resistant for use in acidic environments (e.g., fuel cells). As used herein, the term "corrosion resistant" refers to the ability of catalyst layer 10 to retain at least the above-discussed suitable atomic percentages of carbon, nitrogen, and the transition metal after exposure to a 0.5-molar solution of sulfuric acid ($H_2SO_4$) for at least one week. Moreover, because the catalytic material is substantially free of platinum, and in one embodiment, is substantially free of precious metals, the material costs of catalyst layer 10 are reduced.

Figure 3A:
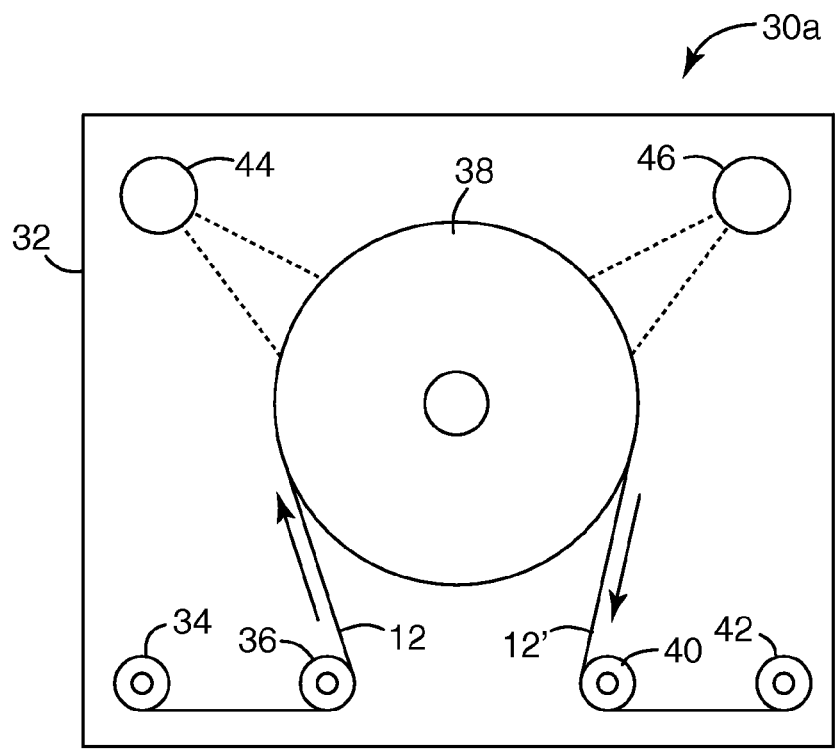
FIG. 3A is a schematic illustration of a physical vapor deposition system that is suitable for use with the method for making an oxygen-reducing catalyst layer.
Figure 3B:
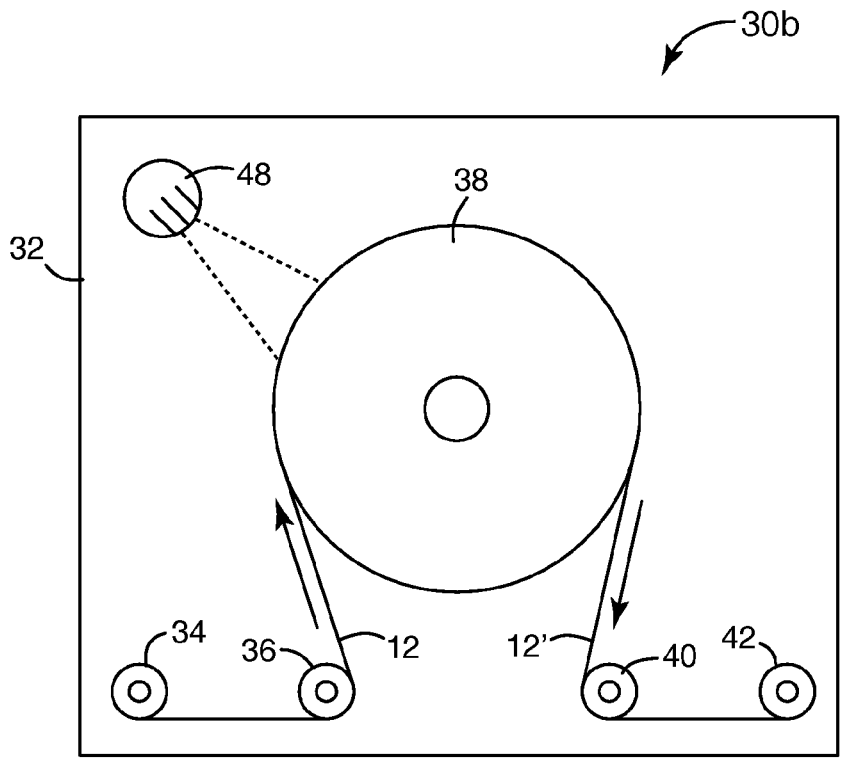
FIG. 3B is a schematic illustration of an alternative physical vapor deposition system that is suitable for use with the method for making an oxygen-reducing catalyst layer.

FIGS. 3A and 3B are schematic views of PVD systems 30a and 30b, respectively, which are alternative systems for physical vapor depositing the catalytic material onto substrate 12, pursuant to step 24 of method 18 (shown above in FIG. 2). As shown in FIG. 3A, PVD system 30a includes chamber 32, supply rollers 34 and 36, support wheel 38, retrieval rollers 40 and 42, carbon target 44, and transition metal target 46. Examples of suitable systems for PVD system 30a include DC magnetron sputtering system and pulsed-cathodic arc devices disclosed in Selifanov et al., U.S. Pat. Nos. 5,643,343 and 5,711,773, which are modified to include carbon target 44 and transition metal target 46.

Chamber 32 is a PVD chamber in which the first processing environment is generated, pursuant to step 20 of method 18 (shown above in FIG. 2). Supply rollers 34 and 36, support wheel 38, and retrieval rollers 40 and 42 are rollers than provide a web path for substrate 12 during the PVD processing. Carbon target 44 and transition metal target 46 are disposed adjacent support wheel 38 for respectively physical vapor depositing carbon atoms and transition metal atoms onto substrate 12 as substrate 12 rotates around support wheel 38 (in a clock-wise direction in FIG. 3A).

As further shown in FIG. 3A, carbon target 44 is located upstream from transition metal target 46. As a result, carbon target 44 deposits carbon atoms onto substrate 12 before transition metal target 46 deposits transition metal atoms. As substrate 12 passes under carbon target 44, the dislodged carbon atoms travel toward substrate 12, where they condense along with ionized atoms. Subsequently, as substrate 12 then passes under transition metal target 46, the dislodged transition metal atoms travel toward substrate 12, where they condense along with ionized nitrogen atoms, on top of the previously condensed carbon/nitrogen atoms.

This two-step deposition process generally provides two layers for film 14, where the bottom layer disposed on surface 16 of substrate 12 generally includes carbon and gas atoms (e.g., nitrogen), and the top layer generally includes the transition metal and gas atoms (e.g., nitrogen). It is noted, however, that a substantial amount of intermixing occurs between the top layer and the bottom layer of film 14. Additionally, as discussed above, the two-step deposition process may be performed multiple times to increase the amount of catalytic material deposited onto substrate 12. After the PVD processing, the resulting coated substrate 12' is then received at retrieval roller 42 for transport to the thermal treatment system (not shown).

In an alternative embodiment in which substrate 12 is provided as carbon particles, powders, or fibers, substrate 12 may function as a carbon target, thereby precluding the need for carbon target 44. In this embodiment, the ionized gas atoms dislodge carbon atoms from substrate 12, which condense on surface 16 with the transition metal atoms and ionized gas atoms, thereby forming film 14.

As shown in FIG. 3B, PVD system 30b includes the same components as PVD system 30a, and generally operates in the same manner, except that carbon target 44 and transition metal target 46 are replaced with composite cathode 48. Composite cathode 48 is a single component that includes the carbon target and the transition metal target, thereby depositing the carbon atoms and the transition metal atoms onto substrate 12 in a substantially simultaneous manner. In this embodiment, during the PVD process, the dislodged carbon atoms and transition metal atoms travel toward substrate 12 substantially simultaneously, where they condense along with ionized nitrogen atoms. As a result, film 14 is a single layer that includes a substantially homogenous mixture of carbon, nitrogen, and the transition metal.

An example of a suitable arrangement for composite cathode 48 includes a graphite-carbon target that contains drilled holes for the insertion of transition metal wires. In this embodiment, the transition metal target is actually made up of a plurality sub-targets of the transition metal wires. The relative surface areas of the graphite-carbon target and the transition metal wires will generally dictate the ratios of carbon-to-transition metal that are deposited. For example, composite cathode 48 may formed from a carbon/graphite cylinder. Holes are then drilled into the cross-sectional surface of the cylinder and wires of the transition metal are then secured in the drilled holes.

Examples of suitable carbon/graphite cylinders include graphite cathodes commercially available under the trade designation "FRAGE SFG2" from Poco Graphite, Decatur, Tex. Examples of suitable wires of the transition metal include iron wires commercially available from Alpha-Aesar, Ward Hill, Mass. Suitable dimensions for composite cathode 48 include a 33-millimeter diameter carbon/graphite cylinder, which is interpenetrated with a number of wires of the transition metal (e.g., 25-50 wires), each of which are 1-centimeter in length, and 1-2 millimeter diameters.

An example of another suitable arrangement for composite cathode 48 includes a mixed target, in which a carbon target is doped with the transition metal. For example carbon particles and transition metal particles may be hot pressed together to create a mixed target. This allows the carbon atoms and transition metal atoms to travel toward substrate 12 substantially simultaneously.

Figure 4:
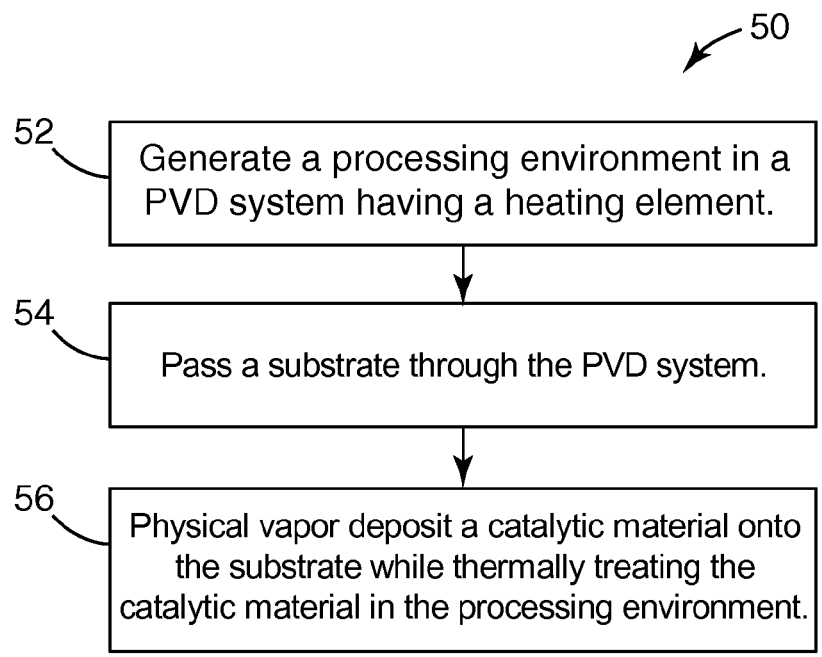
FIG. 4 is a flow diagram of an alternative method of the present invention for making an oxygen-reducing catalyst layer.

FIG. 4 is a flow diagram of method 50, which is an alternative to method 18, shown above in FIG. 2. As shown in FIG. 4, method 50 includes steps 52-56, and initially involves generating a processing environment in the PVD system (e.g., PVD system 30a or 30b) (step 52). The processing environment is generated in the same manner as discussed above in step 22 of method 18 for the first processing environment (shown above in FIG. 2).

In the embodiment shown in FIG. 4, the PVD system also includes a heating element (not shown in FIG. 3A or 3B) to thermally treat the catalytic material during the PVD process. An example of a suitable heating element includes a heating plate that substrate 12 passes over (or is placed on for a non-continuous process). The heating plate conductively heats substrate 12, thereby thermally treating the catalytic material as it is deposited. Examples of suitable processing temperatures for the heating element include temperatures of at least about 350° C., with even more suitable processing temperatures including temperatures of at least about 600° C.

Once the processing environment is generated, substrate 12 is passed through the PVD system (step 54), thereby exposing substrate 12 to the processing environment and the heating element. Substrate 12 is desirably exposed to the heating element for a sufficient duration to heat substrate 12 to the processing temperature. The PVD system then deposits catalytic material onto substrate 12 via a PVD process. This occurs while substrate 12 is disposed in the processing environment, and while the heating element thermally treats the deposited catalytic material (step 56). As a result, the PVD process and the thermal treatment are performed in a substantially simultaneous manner, which reduces the time required to manufacture catalyst layer 10.

After the combined PVD processing/thermal treatment, catalyst layer 10 may be removed from the PVD system for subsequent use in PEM fuel cells. The resulting catalyst layer 10 formed pursuant to method 50 also exhibits good catalytic activity for reducing oxygen, is corrosion resistant, and is substantially free of platinum and/or precious metals, as discussed above.

In the embodiment of the present invention wherein particles or powders are used as the substrate for PVD deposition of the catalyst material, the thermally processed, PVD-treated particles or powders can be fashioned into a catalyst layer for use in a fuel cell through means known in the art. For example, the particles of powder can be mixed with an electrolytic material, such as a aqueous Nafion dispersion, to form an ink. This ink is thereafter deposited onto a membrane or a gas diffusion layer (GDL). If the material is deposited onto the GDL, the GDL is placed in contact with the membrane.)

Figure 5:
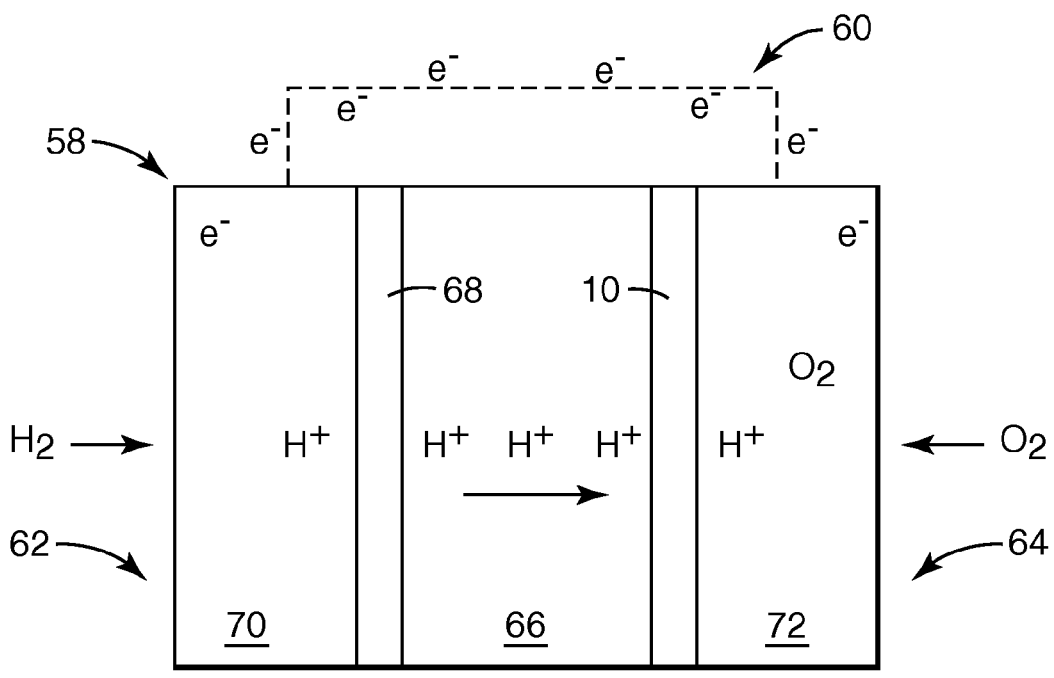
FIG. 5 is a schematic illustration of an MEA in use with an external electrical circuit, where the MEA includes an oxygen-reducing catalyst layer.

FIG. 5 is a schematic illustration of MEA 58 in use with external electrical circuit 60, where MEA 58 includes catalyst layer 10 formed pursuant to a method of the present invention (e.g., methods 20 and 50). MEA 58 is suitable for use in electrochemical cells, such as PEM fuel cells, and further includes anode portion 62, cathode portion 64, electrolyte membrane 66, anode catalyst layer 68, and gas diffusion layers 70 and 72. Anode portion 62 and cathode portion 64 generally refer to the anode and cathode sides of MEA 58.

Electrolyte membrane 66 may be any suitable ion-conductive membrane, such as a PEM. Examples of suitable materials for electrolyte membrane 66 include acid-functional fluoropolymers, such as copolymers of tetrafluoroethylene and one or more fluorinated, acid-functional comonomers. Examples of suitable commercially available materials include fluoropolymers under the trade designations "NAFION" from DuPont Chemicals, Wilmington, Del.

Catalyst layer 10 is a cathode catalyst layer disposed between electrolyte membrane 66 and gas diffusion layer 72, where substrate 12 is in contact with gas diffusion layer 72, and film 14 is in contact with electrolyte membrane 66. In one embodiment, substrate 12 serves as gas diffusion layer 72. During the assembly of MEA 50, film 14 of catalyst layer 10 is positioned in contact with electrolyte membrane 66 such that substrate 12 contacts gas diffusion layer 72. This provides conductive contact between electrolyte membrane 66 and gas diffusion layer 72. In one embodiment, the catalytic activity of catalyst layer 10 is increased by acid washing prior to assembly in MEA 50, which removes excess metal.

Anode catalyst layer 68 is disposed between electrolyte membrane 66 and gas diffusion layer 70, where gas diffusion layer 70 is located at anode portion 62 of MEA 58. Gas diffusion layers 70 and 72 may each be any suitable electrically conductive porous substrate, such as carbon fiber constructions (e.g., woven and non-woven carbon fiber constructions). Gas diffusion layers 70 and 72 may also be treated to increase or impart hydrophobic properties.

During operation of MEA 58, hydrogen fuel ($H_2$) is introduced into gas diffusion layer 70 at anode portion 62. MEA 58 may alternatively use other fuel sources, such as methanol, ethanol, formic acid, and reformed gases. The fuel passes through gas diffusion layer 70 and over anode catalyst layer 68. At anode catalyst layer 68, the fuel is separated into hydrogen ions ($H^+$) and electrons ($e^-$). Electrolyte membrane 66 only permits the hydrogen ions to pass through to reach catalyst layer 10 and gas diffusion layer 72. The electrons generally cannot pass through electrolyte membrane 66. As such, the electrons flow through external electrical circuit 60 in the form of electric current. This current can power an electric load, such as an electric motor, or be directed to an energy storage device, such as a rechargeable battery.

Oxygen ($O_2$) is introduced into gas diffusion layer 72 at cathode portion 64. The oxygen passes through gas diffusion layer 72 and over catalyst layer 10. At catalyst layer 10, oxygen, hydrogen ions, and electrons combine to produce water and heat. As discussed above, catalyst layer 10 exhibits good catalytic activity for reducing oxygen which increases the efficiency of MEA 58. Additionally, because catalyst layer 10 is corrosion resistant, catalyst layer 10 may perform in MEA 58 for extended periods of time.

EXAMPLES

The present invention is more particularly described in the following examples that are intended as illustrations only, since numerous modifications and variations within the scope of the present invention will be apparent to those skilled in the art. Unless otherwise noted, all parts, percentages, and ratios reported in the following examples are on a weight basis, and all reagents used in the examples were obtained, or are available, from the chemical suppliers described below, or may be synthesized by conventional techniques.

Example 1 and Comparative Example A

An MEA of Example 1 was prepared pursuant to the following procedure. A catalyst layer was prepared by physical vapor depositing a catalyst material onto a carbon non-woven fabric substrate (commercially available under the product no. FC-H2315 from Freudenberg Non-Wovens Technical Division, Lowell, Mass.). The physical vapor deposition was performed in a processing environment containing nitrogen gas, with a pulsed cathodic arc plasma generating system described in Selifanov et al., U.S. Pat. Nos. 5,643,343 and 5,711,773. The use of the system for depositing carbon and nitrogen is described by Andrei Stanishevsky, "Quasiamorphous Carbon and Carbon Nitride Films Deposited from the Plasma of Pulsed Cathodic Arc Discharge" in Chaos, Solitons and Fractals, Vol. 10 pp 2045-2066 (1999).

The system was modified to include a composite cathode that contained a carbon target and a transition metal (i.e., iron) target. The composite cathode included a 33-milimeter-diameter graphite-carbon target (commercially available under the trade designation "GRADE SFG2" from Poco Graphite, Decatur, Tex.), having 56 drilled holes in the cross-section surface for retaining iron-wire targets. Each iron-wire target had a 2.0-millimeter diameter, and a 1-centimeter length (commercially available from Alpha-Aesar, Ward Hill, Mass.).

The system was evacuated to less than about $1 \times 10^{-5}$ Torr, and then nitrogen gas was introduced to provide any operating pressure of about 2-3 milliTorr. The system was operated with main, auxiliary and ignition capacitances of 2,200, 185, and 10 microfarads, respectively; main, auxiliary and ignition voltages of 250, 300, and 700 volts; and a discharge frequency of about 4 hertz. A web of the carbon non-woven fabric substrate was passed through the system 18 times with line speeds of 61 centimeters/minute (24 inches/minute). The multiple passes were used to increase the amount of catalyst material deposited per unit area of the substrate. After the PVD process was completed, the system was then filled with nitrogen gas to atmospheric pressure and the coated substrate was removed.

The coated substrate was then thermally treated in a quartz tube furnace (commercially available under the trade designation "RTP600S" from Modular Process Technology, San Jose, Calif.). Nitrogen gas was introduced into the furnace to purge residual gases. Once the residual gases were substantially purged, a second processing environment was prepared by continuously introducing ammonia gas into the furnace prior to, and during, the thermal treatment. The coated catalyst was placed in the furnace, and the temperature was ramped up at a rate of 6° C./minute until a processing temperature of 900° C. was reached. The temperature was then held at 900° C. for 15 minutes. The resulting catalyst layer remained in the furnace until it cooled to about room temperature prior to removal.

A pair of PEMs (commercially available under the trade designation "NAFION 112" from DuPont Chemical Co., Wilmington, Del. were then placed between the prepared catalyst layer (which functioned as a cathode catalyst layer) and a anode catalyst layer. The anode catalyst layer included a platinum/carbon-dispersed ink coated on a carbon-paper gas diffusion layer. The carbon-paper gas diffusion layer was fabricated by coating a gas diffusion micro-layer on one side of a carbon fiber paper (commercially available under the trade designation "AVCARB P50 Carbon Fiber Paper" from Ballard Material Products, Lowell, Mass.) that had been treated for hydrophobicity. The anode catalyst platinum loading ranged from about 0.3 milligrams Pt/centimeter$^2$ to about 0.4 milligrams Pt/centimeter$^2$. The resulting MEA of Example 1 was assembled in a 50-centimeter$^2$ test cell fixture (available from Fuel Cell Technologies, Albuquerque, N. Mex.) having quad-serpentine flow fields, at about 25% to about 30% compression.

The MEA of Comparative Example A was prepared in the same manner as discussed above for the MEA of Example 1, except that the coated substrate was not thermally treated. Therefore, after the PVD process, the coated substrate was directly assembled with the pair of PEMs and the anode catalyst layer to provide the MEA of Comparative Example A.

The catalytic activity of each of the MEAs of Example 1 and Comparative Example A was measured pursuant to the following "polarization measurement method". The measurement involved recording the polarization curves under oxygen using a potentiostat (commercially available under the trade designation "SOLARTRON CELLTEST 1470" from Solartron Analytical, Oak Ridge, Tenn.) and a software package (commercially available under the trade designation "CORWARE" from Scribner Associates, Inc., Southern Pines, N.C.).

Cyclic voltammograms were performed at 50, 20, 10 and 5 millivolts/second between 0.01 volts and 1.1 volts. In order to compare the catalytic activity, the comparisons were made at the same voltage using a scan rate of 5 millivolts/second. Hydrogen and oxygen streams introduced to the anode and cathode sides of the cell each had a flow rate of 500 standard cubic centimeters/minute (SCCM) at ambient pressure. The measurements were taken at 75° C. with approximately 150% relative humidity.

Figure 6:
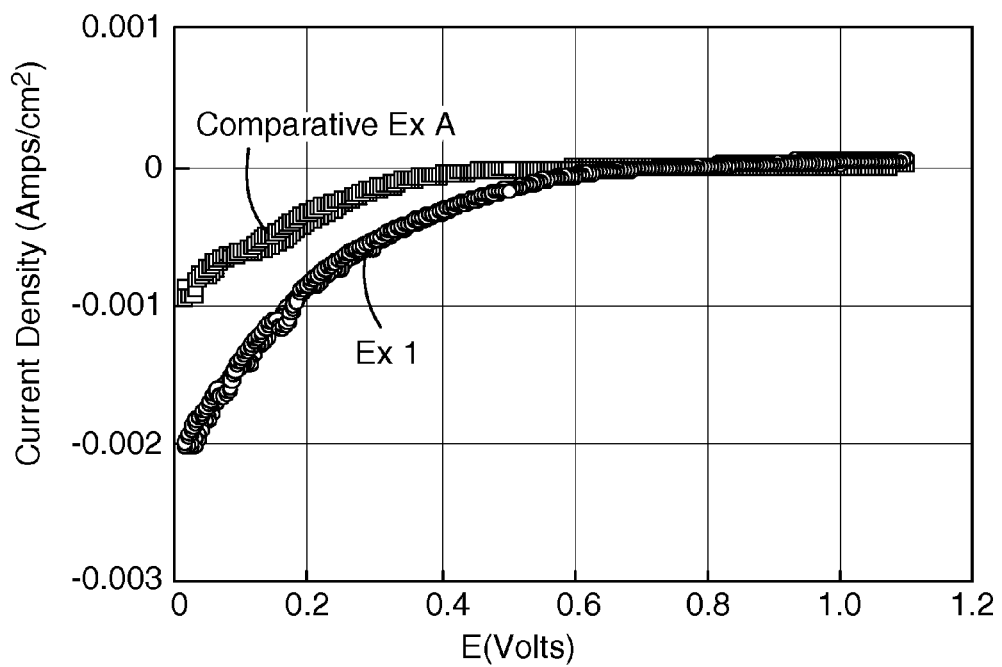
FIG. 6 is a graph of polarization curves for MEAs containing oxygen-reducing catalyst layers of the present invention, and comparative MEAs.

FIG. 6 is a graph of the polarization curves measured pursuant to the polarization measurement method for the MEAs of Example 1 and Comparative Example A. As shown, the MEA of Example 1 exhibited higher catalytic activity compared to the MEA of Comparative Example A. This is believed to be due to the thermal treatment of the catalyst layer. Accordingly, the catalyst layers of the present invention, which are made with the use of a PVD process and thermal treatment, exhibit good catalytic activity for use in electrochemical devices, such as fuel cells.

The alternating current (AC) impedances was measured for each of the MEAs of Example 1 and Comparative Example A pursuant to the following "AC impedance measurement" to determine resistance of the catalyst layer, as well as the interference resistance between the catalyst layer and the PEM. The AC impedance was measured using a potentiostat (commercially available under the trade designation "SOLARTRON CELLTEST 1470" from Solartron Analytical, Oak Ridge, Tenn.), with a frequency response analyzer (commercially available under the trade designation "SOLARTRON SI 1250" from Solartron Analytical), and a software package (commercially available under the trade designation "ZPLOT" from Scribner Associates, Inc., Southern Pines, N.C.). Measurements were taken at open circuit voltage under hydrogen in the frequency range of 1 hertz-10 kilohertz. The hydrogen streams introduced to the anode and cathode sides of the cell each had a flow rate of 500 standard cubic centimeters/minute (SCCM). The measurements were taken at 75° C. with approximately 150% relative humidity.

Figure 7:
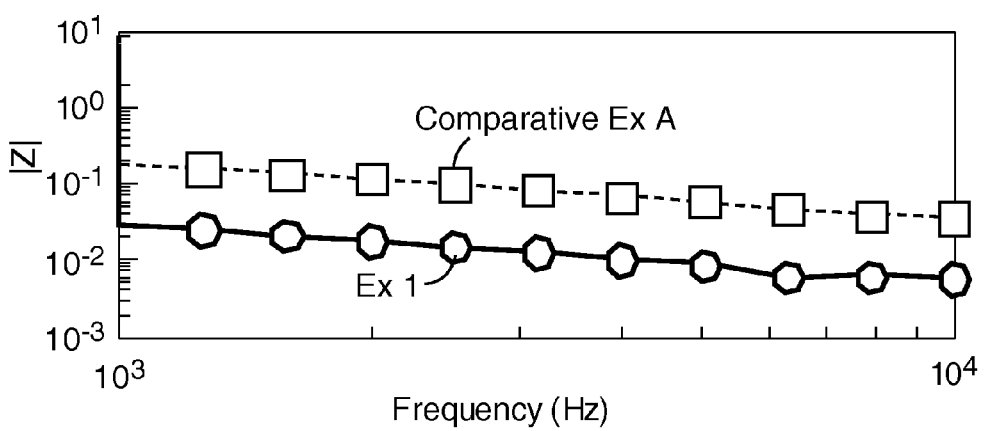
FIG. 7 is a graph of AC impedances for MEAs containing oxygen-reducing catalyst layers of the present invention and comparative MEAs.
Figure 8:
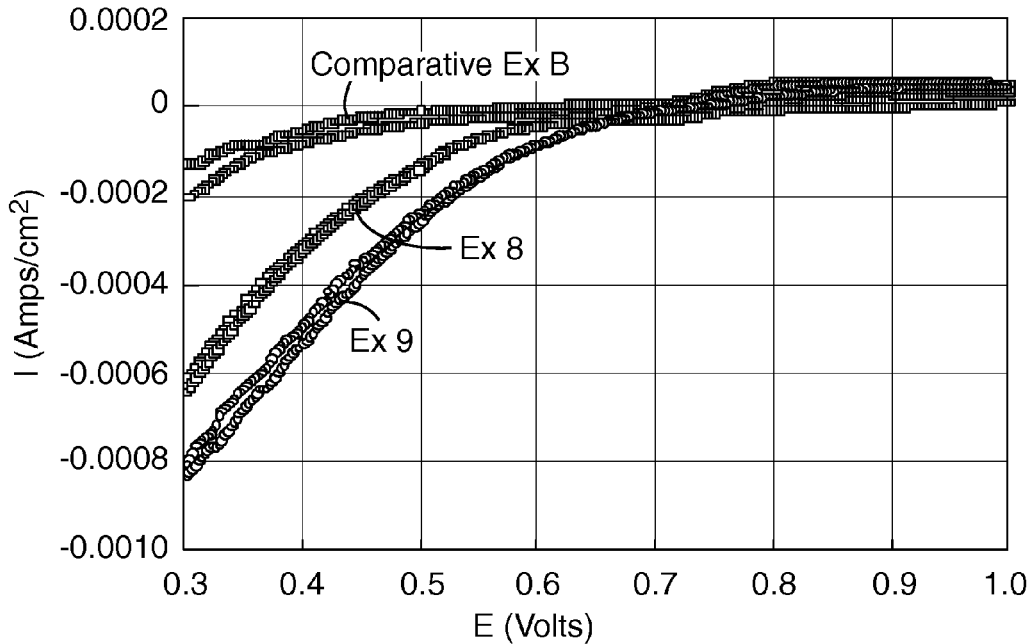
FIG. 8 is a graph of polarization curves for MEAs containing oxygen-reducing catalyst layers of the present invention and a comparative MEA, where the oxygen-reducing catalyst layers were formed with physical vapor depositions and thermal treatments performed in a substantially simultaneous manner.

FIG. 7 is a graph of the AC impedances measured pursuant to the AC impedance measurement method for the MEAs of Example 1 and Comparative Example A. As shown, the MEA of Example 1 exhibits lower impedances compared to the MEA of Comparative Example A. Similar to catalytic activity, this is believed to be due to the thermal treatment of the catalyst layer.

Examples 2-7 and Comparative Example B

MEAs of Examples 2-7 were each prepared pursuant to the same procedure discussed above for the MEA of Example 1, except that the composite cathode included 45 iron-wire targets, where each iron-wire target had a 1.2-millimeter diameter, and a 1-centimeter length (also commercially available from Alpha-Aesar, Ward Hill, Mass.). Additionally, the system was operated with main, auxiliary and ignition capacitances of 2,200, 185, and 20 microfarads, respectively, and the web of the carbon non-woven fabric substrate was passed through the system 10 times with line speeds of 30.5 centimeters/minute (12 inches/minute). Furthermore, the conditions for thermally treating the coated substrates of Examples 2-7 were varied, as shown below in Table 1. After the thermal treatment the resulting catalyst layer was then assembled in an MEA in the same manner as discussed above for the MEA of Example 1.

The MEA of Comparative Example B was prepared in the same manner as discussed above for the MEAs of Examples 2-7, except that the coated substrate was not thermally treated. The catalytic activities of the MEAs of Examples 2-7 and Comparative Example B were then measured pursuant to the "polarization measurement method", discussed above. Table 1 lists the processing temperature and processing environment gas used during the thermal treatment, and the catalytic activity results at 0.6 volts, for the MEAs of Examples 2-7 and Comparative Example B.

TABLE 1

| Example | Processing temperature (° C.) | Processing Environment Gas | Catalytic Activity at 0.6 volts (mA/cm$^2$) |
|---|---|---|---|
| Comparative Example B | None | None | 0.014 |
| Example 2 | 400 | Nitrogen | 0.031 |
| Example 3 | 600 | Nitrogen | 0.069 |
| Example 4 | 800 | Nitrogen | 0.088 |
| Example 5 | 400 | Ammonia | 0.029 |
| Example 6 | 600 | Ammonia | 0.108 |
| Example 7 | 800 | Ammonia | 0.134 |

As shown in Table 1, the thermal treatment increases the catalytic activity of the MEAs. Thus, the catalyst layers of the present invention exhibit good catalytic activity for use in electrochemical devices, such as fuel cells. In addition, as discussed above, the catalyst layers are substantially free of platinum (and precious metals in one embodiment), thereby reducing materials costs.

As further shown in Table 1, the thermal treatment in ammonia (i.e., Examples 5-7) provided MEAs having higher catalytic activities compared to the thermal treatment in nitrogen (i.e., Examples 2-4). This is believed to be due to the higher reactivity of ammonia during the thermal treatment relative to nitrogen.

Examples 8 and 9

MEAs of Examples 8 and 9 were each prepared pursuant to the following procedure, which involved performing the thermal treatment in a substantially simultaneous manner with the PVD process. The PVD system used was the same as discussed above for Example 1, except that the composite cathode included 42 iron-wire targets. Additionally, instead of a web drive, the substrate was mounted to a surface of a molybdenum plate, which included a heating element (commercially available under the trade designation "BORALECTRIC" Boron Nitride from Tectra GmbH, Germany) disposed on the reverse surface. The heater temperature was controlled via a proportional-integral-derivative (PID) controller (model REX-P300 from RKC Instrument Inc., South Bend, Ind.).

A processing environment was prepared by introducing a gas (90% nitrogen and 10% ammonia, by volume) at a flow rate of 250 SCCM, which provided an operating pressure of about 1 milliTorr. The system was operated with main, auxiliary and ignition capacitances of 2,200, 185, and 20 microfarads, respectively; main, auxiliary and ignition voltages of 250, 350, and 600 volts; and a discharge frequency of 8.0 hertz. For Example 8, the catalytic material was deposited with 2,500 pulses and a substrate temperature of 550° C. For Example 9, the catalytic material was deposited with 4,000 pulses and a substrate temperature of 625° C. After the PVD/thermal treatment, the resulting catalyst layers of Examples 8 and 9 were then assembled in an MEA in the same manner as discussed above for the MEA of Example 1.

Figure 9:
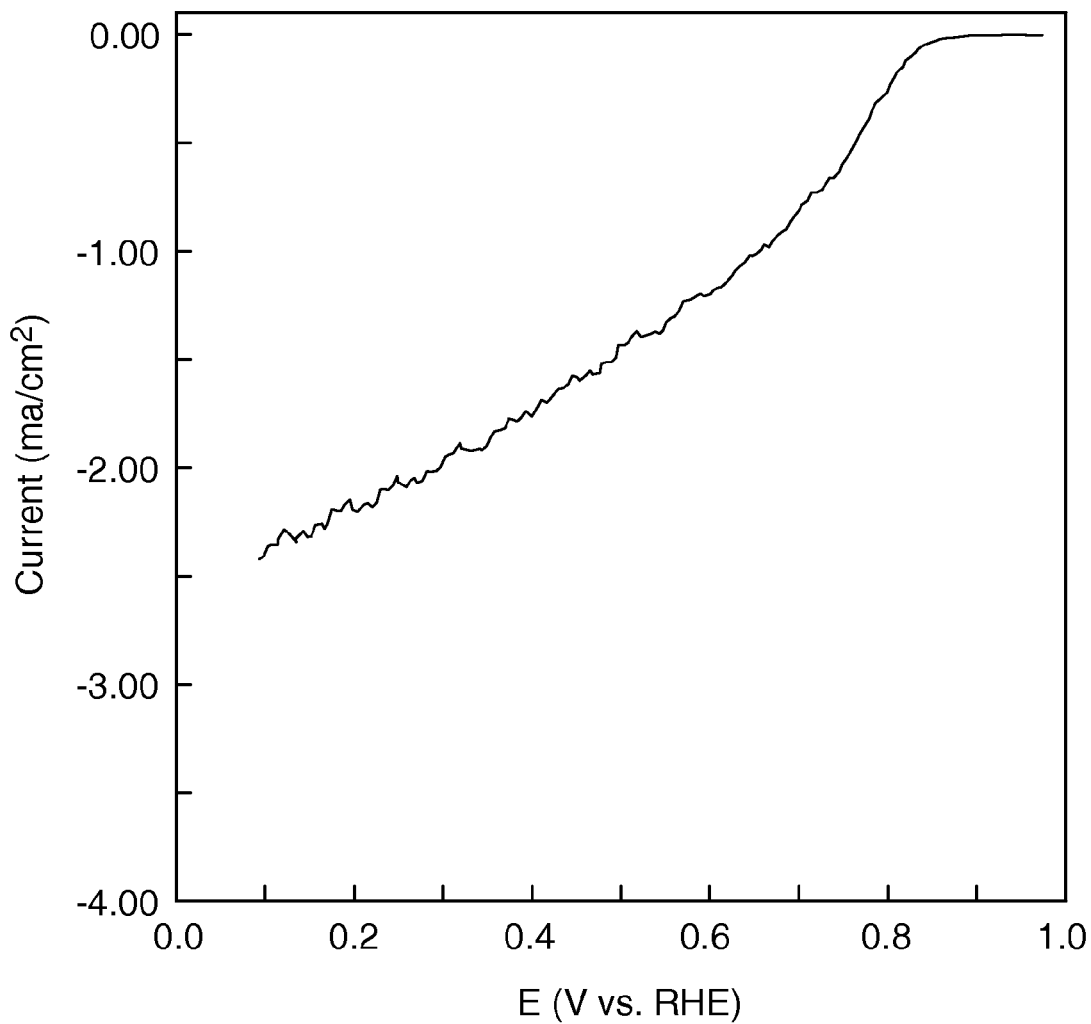
FIG. 9 is a graph showing a rotating disk electrode measurements of an oxygen-reducing catalyst layer of the present invention.

The catalytic activities of the MEAs of Examples 8 and 9, and Comparative Example B, were then measured pursuant to the "polarization measurement method", discussed above. FIG. 9 is a graph of the polarization curves for the MEAs of Examples 8 and 9, and Comparative Example B. As shown, at 0.5 millivolts, the MEA of Example 8 exhibited a catalytic activity of 0.130 mA/cm$^2$, and the MEA of Example 9 exhibited a catalytic activity of 0.234 mA/cm$^2$. Moreover, as shown in FIG. 9, the thermal treatment increases the catalytic activity of the catalyst layer, and is generally proportional to the processing temperature used.

Example 10

A catalytic $C_{1-x-y}N_xFe_y$ material film was prepared using a DC Magnetron sputtering system to deposit catalytic material onto a disk (e.g., a glassy carbon disk, silicon wafer, glass slide, or quartz slide). The sputtering system is outlined in J. R. Dahn, S. Trussler, T. D. Hatchard, A. Bonakdarpour, J. N. Meuller-Neuhaus, K. C. Hewitt and M. Fleischauer, "Economical sputtering system to produce large-size composition-spread libraries having linear and orthogonal stoichiometry variations", Chemistry of Materials, 14 (8), 3519-3523 (2002). The processing environment included an argon/nitrogen mixture as outlined in E. Bradley Easton, Th. Buhrmester and J. R. Dahn, "Preparation and Characterization of Sputtered $Fe_{1-x}N_x$ Films", Thin Solid Films 493, 60-66 (2005). The film was prepared using a constant mask over a graphite target and a linear mask over the transition metal target (i.e., iron or cobalt).

Once the sputtering process was complete for a given film, the film was thermally treated using a Modular Pro Rapid Thermal Processing station, and a processing environment of argon gas. A processing temperature of 1000° C. was used. However, for each film, the temperature was ramped up at a rate of 5° C./second until the processing temperature was reached. The processing temperature was then maintained for one minute. The resulting annealed film was then cooled to room temperature in an argon atmosphere.

A "composition analysis" of the film was made using a microanalyzer commercially available under the trade designation "JXA-8200 SUPERPROBE" Electron Probe Microanalyzer from JEOL USA, Inc., Peabody, Mass. The microanalyzer was equipped with one energy dispersive spectrometer, five wavelength dispersive (WDS) spectrometers, and an automated motion stage. Silicon nitride was used as the nitrogen standard while magnetite was used as the iron standard. The elemental composition was determined using the WDS detector and had an estimated uncertainty of ±0.3%. The composition was measured on a disk library, point by point, with point sizes of 5 micrometers. The disk library was 200-nanometers thick and both EDS and WDS measured the average composition throughout that thickness.

The film was then each measured using a "rotating-ring disk electrode measurement" method, which was performed in a one-compartment cell with 0.1-molar $HClO_4$ as the electrolyte. A mercury/mercury sulfate reference electrode was used. Data was collected at 65° C. Cyclic voltammograms (CVs) at 5 millivolts/second were performed in an oxygen saturated solution. FIG. 9 is a graph showing a rotating disk electrode measurements at 65° C. under oxygen for the film of Example 10 at 900 RPM.

Examples 11 and 12 and Comparative Example C

Catalytic $C_{1-x-y}N_xFe_y$ material films were each prepared on glass or quartz slides in the same manner as discussed above for the films of Example 10, except that the film of Comparative Example C was not thermally treated, the thermal treatment for film of Example 11 had a processing temperature of 600° C., and the thermal treatment for film of Example 12 had a processing temperature of 800° C. The films were otherwise compositionally the same.

The films of Examples 11 and 12, and Comparative Example C were then subjected to a "corrosion resistance test", which involved placing each film in a 0.5-Molar sulfuric acid ($H_2SO_4$) solution for 7 days. The films were then visually examined to determined how much of each film was dissolved. After the corrosion resistance test, the catalytic materials of the films of Example 11 and Comparative Example C were completely dissolved. In contrast, however, the catalytic material of the film of Example 12 remained with an atomic percentage of carbon, nitrogen, and iron within the above-discussed suitable atomic percentages. Accordingly, the thermal treatment at 800° C. increased the corrosion resistance of the film of Example 12.

The results of the rotating-ring disk electrode measurements of the film of Example 10, and the corrosion resistance results of the film of Example 12, illustrate the catalytic $C_{1-x-y}N_xFe_y$ material films that exhibited good catalytic activity and which were corrosion resistant to acidic environments. Accordingly, such films are suitable for use in the acidic environments of electrochemical devices, such as fuel cells.

Examples 13a-13c

Figures 10A, 10B, 10C:
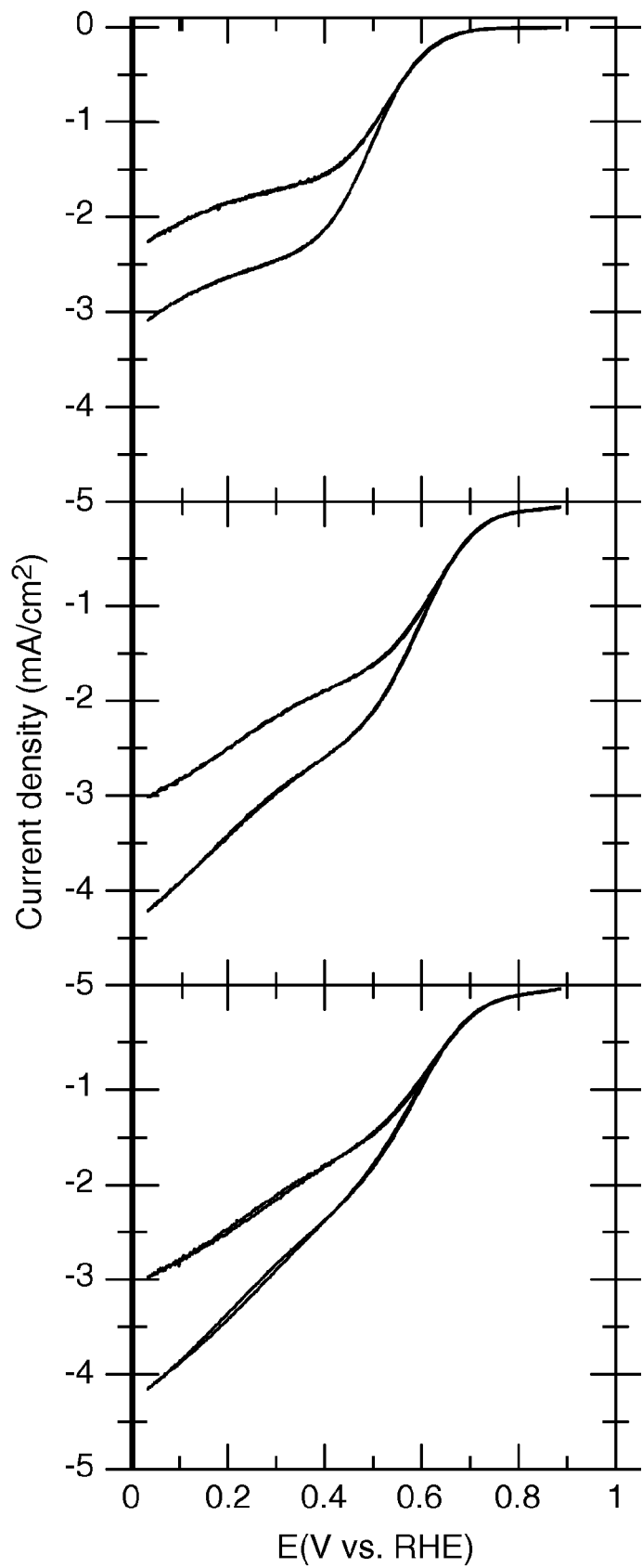
FIGS. 10A-10C are graphs showing rotating disk electrode measurements of additional oxygen-reducing catalyst layer of the present inventions.

Catalytic $C_{1-x-y}N_xCo_y$ material films of Examples 13a-13c were each prepared in the same manner as discussed above for the films of Example 10, except that the iron target was replaced with a cobalt target. The atomic percentages of the films of Example 13a-12c were respectively $C_{0.90}N_{0.04}Co_{0.06}$, $C_{0.86}N_{0.06}Co_{0.08}$, and $C_{0.82}N_{0.10}Co_{0.08}$. The films were each measured using the rotating-ring disk electrode measurement method, which was performed as discussed above in Example 10, except that the measurements were performed at room temperature (i.e., 25° C.). FIGS. 10A-10C are graphs showing rotating disk electrode measurements at room temperature under oxygen for the films of Example 13a-13c, respectively.

The results of the rotating-ring disk electrode measurements for the films of Example 13a-13c illustrate the catalytic $C_{1-x-y}N_xCo_y$ material films that exhibited measurable catalytic activity. The results also show that the behaviors of the catalyst films may be varied by the atomic percentages of the catalytic materials and by thermal processing.

Examples 14 and 15

An MEA of Example 14 involved a catalyst formed by PVD of iron on finely-divided carbon particles. The film was prepared by DC magnetron sputtering as described in Brey et al., U.S. Publication No. US 2005/0095189, with an iron target. A 30 grams sample of Acetylene Black (commercially available under the trade designation "Y50A" Acetylene Black, from SN2A, France) was dried for 12 hours at 130° C. in a box oven. The sputtering chamber was charged with 16.76 grams of the dry Acetylene Black. The chamber was then evacuated to $5 \times 10^{-5}$ Torr and argon gas was introduced into the chamber at a pressure of about 10 milliTorr. The iron deposition process was initiated by applying a cathodic power of 0.1 kW using a 99.9% iron target (3-inches round and 0.063-inches thick, from Kurt J. Lesker Company, Clairton, Pa.). Argon was introduced as the sputter gas at 34 SCCM. The carbon powder was agitated during the sputtering by turning the particle agitator shaft at 10 RPM. After a total of 0.23 kWH was expended, the reaction was stopped and the chamber was backfilled with air and the sample was removed from the reactor. The target weight loss after this treatment was 0.95 grams.

The iron-treated film was placed in a fused silica boat and placed in a tube furnace for the thermal treatment. The tube was flushed with nitrogen to remove traces of air and the heat treatment employed was as follows: room temperature to 400° C. at 6° C./minute under nitrogen, hold at 400° C. for 4 hours under nitrogen/30% ammonia ($NH_3$), heat to 900° C. at 8° C./minute, and hold at 900° C. for 1 hour under nitrogen/30% ammonia. The furnace was then allowed to cool while maintaining the nitrogen/ammonia atmosphere.

After cooling, the film washed with 0.54 M sulfuric acid by soaking 4 grams of the film in 300 grams of the acid overnight. The sample was removed by filtration, washed extensively with deionized water, and dried at 130° C. in an oven. 2.0 grams of this dried catalyst material was then dispersed in 150 grams of water and the resulting dispersion was sonicated for 10 minutes using an ultrasonic horn (commercially available under the trade designation "Sonics VCX VIBRACELL" from Sonics and Materials Inc., Newton, Mass.). The dispersion was then dried at 130° C. and the dried particles were used to prepare the coating dispersion.

A dispersion of the catalyst particles was prepared by mixing 1.5 grams of the acid-washed, ultrasonically-treated catalyst particles with 10 grams of an 11.3% (by weight) aqueous dispersion (commercially available under the trade designation "NAFION" from E.I. Du Pont De Nemours Inc., Willmington, Del.) and 10 grams of water in a beaker. The mixture was heated to about 100° C. on a hot plate for 30 minutes. After cooling, the sample was stirred. A coating of 88 milligrams of the catalyst ink dispersion was hand brushed onto a 50-centimeter$^2$ carbon paper support (commercially available under the trade designation "AVCARB P50" Carbon Fiber Paper from Ballard Material Products, Lowell, Mass.), which was previously treated for hydrophobicity and coated with a gas diffusion microlayer. The coated sample was dried at 110° C. under vacuum (~25 in Hg) for approximately 20 minutes.

This catalyst coated backing (CCB) was used as the cathode catalyst and GDL layer of an MEA.

The anode catalyst was a dispersed Pt/C catalyst layer as described in Example 1. Gaskets were selected for 25-30% compression on both the anode and the cathode. Using a static press, the anode and cathode catalysts were bonded to a pair of cast "NAFION" membranes (each approximately 30 micrometers thick, 1000 EW) at 132° C.-138° C. (270° F.-280° F.) and 1,361-1,814 kilograms (3,000-4,000 pounds) for 10 minutes. The resulting MEA was placed into a standard 50-centimeter$^2$ fuel cell test fixture with quad serpentine flow fields (Fuel Cell Technologies).

An MEA of Example 15 involved a catalyst formed by PVD of cobalt on finely-divided carbon particles, and was prepared in the same manner as discussed above for Example 14, except for the following: Cobalt nanoparticles were sputtered onto carbon powder as described in Example 10 with the exception that a 3-inch round and 0.25-inch thick cobalt target was employed rather than an iron target, and 0.3 kWh was used to sputter the cobalt. The target weight loss was 1.35 grams. The cobalt-treated sample heated strongly after exposure to air during the removal of the sample from the sputtering apparatus. The sample was blanketed with nitrogen to moderate the heating due to exposure to air. The resulting cobalt-carbon catalyst particles were then thermally treated in ammonia, dispersed and supported on a carbon paper as described in Example 10 with the exception that 87 milligrams of the sample dispersion was used to prepare the coated fabric.

Figure 11:
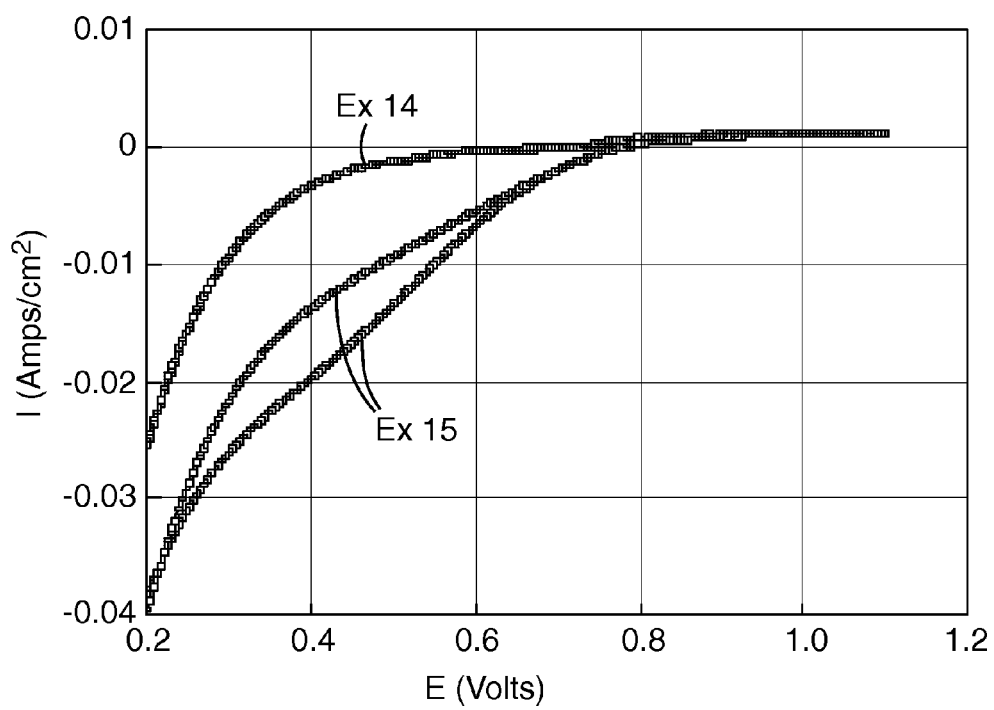
FIG. 11 is a graph of polarization curves for MEAs containing additional oxygen-reducing catalyst layers of the present invention.

The catalytic activity of each of the MEAs of Example 14 and 15 were measured by recording the polarization curves under oxygen in a similar manner to described in "polarization measurement method" discussed above with the following differences: The cell temperature was 80° C.; and hydrogen and oxygen gas streams introduced to the anode and cathode sides of the cell had flow rates of 180 sccm and 335 sccm, respectively. The outlet gas pressures were 30 psig (~3 bar absolute) on the anode and 50 psig (~4.5 bar absolute) on the cathode. Humidity on the gas streams was held at approximately 100% RH. FIG. 11 is a graph of the polarization curves for the MEAs of Examples 14 and 15. The results show that the catalytic layers having carbon-particle substrates also exhibited measurable catalytic activity.

Although the present invention has been described with reference to preferred embodiments, workers skilled in the art will recognize that changes may be made in form and detail without departing from the spirit and scope of the invention.

The invention claimed is:

1. A method of making an oxygen-reducing catalyst layer, the method comprising:
    physical vapor depositing a catalytic material onto a substrate from a first target comprising a transition metal that is substantially free of platinum; and
    thermally treating the catalytic material, wherein at least one of the physical vapor deposition and the thermal treatment is performed in a processing environment comprising a nitrogen-containing gas;
    wherein the catalytic material is further physical vapor deposited onto the substrate from a second target comprising carbon, and
    wherein the physical vapor depositing from the first target and the second target are performed substantially simultaneously.

2. The method of claim 1, wherein the transition metal is substantially free of precious metals.

3. The method of claim 1, wherein the transition metal is selected from the group consisting of iron, cobalt, and combinations thereof.

4. The method of claim 1, wherein the physical vapor depositing and the thermal treating are performed substantially simultaneously.

5. The method of claim 1, wherein the thermal treating is performed at a temperature of at least about 350° C.

6. The method of claim 4, wherein the temperature is at least about 600° C.

7. The method of claim 1, wherein the nitrogen-containing gas is selected from the group consisting of nitrogen, ammonia, aromatic nitrogen compounds, acetonitrile, and combinations thereof.

8. The method of claim 1, wherein the substrate is selected from the group consisting of nanostructured thin film substrates, microstructured thin film substrates, carbon-containing substrates, carbon-containing woven fabrics, carbon-containing non-woven fabrics, titanium suboxide ceramics, nano-tin oxide films, nano-titanium oxide films, non-film-based carbon-containing particles and powders, carbon-containing fibers, and combinations thereof.

9. The method of claim 1, wherein the resulting oxygen-reducing catalyst layer is corrosion resistant.

\* \* \* \* \*

UNITED STATES PATENT AND TRADEMARK OFFICE
CERTIFICATE OF CORRECTION

PATENT NO. : 7,740,902 B2  
APPLICATION NO. : 11/379518  
DATED : June 22, 2010  
INVENTOR(S) : Dennis P O'Brien et al.

Page 1 of 2

It is certified that error appears in the above-identified patent and that said Letters Patent is hereby corrected as shown below:

Title Page  
Item [75] Inventors: delete "Edine" and insert -- Edina -- therefor.

Item [57] Abstract: line 2, delete "sequential stops"  
and insert -- sequential steps -- therefor.

Item [56] Page 2, Other Publications, Column 1, line 65, Lefevre et al.;  
delete "Information Catalysts"  
and insert -- Information for Catalysts -- therefor.

Item [56] Page 2, Other Publications, Column 2, line 12, Debe et al.;  
delete "Derviative" and insert -- Derivative -- therefor.

Item [56] Page 2, Other Publications, Column 2, line 62, J. P. Dodelet;  
delete "Catalysis" and insert -- Catalysts -- therefor.

Drawings  
Sheet 6 of 7, Fig. 9, delete "(ma/cm$^2$)"  
and insert -- (mA/cm$^2$) -- therefor.

Column 1  
Line 13, delete "date, Apr. 20, 2006," and  
insert -- date, Apr. 20, 2006, (Attorney Docket No. 61935US002), -- therefor.

Column 7  
Line 27, delete "FIG. 3A" and insert -- FIGS. 3A -- therefor.  
Line 67, delete "membrane.)" and insert -- membrane. -- therefor.

Column 13  
Line 23, delete "11 and 12 and" and insert -- 11 and 12, and -- therefor.

Signed and Sealed this

Thirtieth Day of November, 2010

David J. Kappos  
*Director of the United States Patent and Trademark Office*

Column 14
Line 42, delete "film washed" and insert -- film was washed -- therefor.
Line 57 - 58, delete "Willmington," and insert -- Wilmington, -- therefor.